(12) United States Patent
Krijn et al.

(10) Patent No.: US 6,191,423 B1
(45) Date of Patent: Feb. 20, 2001

(54) CORRECTION DEVICE FOR CORRECTING THE SPHERICAL ABERRATION IN PARTICLE-OPTICAL APPARATUS

(75) Inventors: Marcellinus P. C. M. Krijn, Eindhoven (NL); Karel Diederick Van Der Mast, Portland, OR (US)

(73) Assignee: Philips Electron Optics B.V., Eindhoven (NL)

( * ) Notice: Under 35 U.S.C. 154(b), the term of this patent shall be extended for 0 days.

(21) Appl. No.: 09/209,969

(22) Filed: Dec. 10, 1998

(30) Foreign Application Priority Data

Dec. 11, 1997 (EP) .................................................. 97203891

(51) Int. Cl.$^7$ .............................. H01J 37/14; H01J 37/10
(52) U.S. Cl. ................................. 250/396 R; 250/396 ML
(58) Field of Search ....................... 250/396 R, 396 ML, 250/311

(56) References Cited

U.S. PATENT DOCUMENTS

| | | | |
|---|---|---|---|
| 4,389,571 | * 6/1983 | Crewe | 250/396 R |
| 4,414,474 | * 11/1983 | Crewe | 250/396 R |
| 5,084,622 | * 1/1992 | Rose | 250/396 R |

OTHER PUBLICATIONS

"Electron Optics", by P. Grivet, Pergamon Press, 1965, section 10.4.2.

* cited by examiner

Primary Examiner—Teresa M. Arroyo
Assistant Examiner—Nikita Wells
(74) Attorney, Agent, or Firm—Fulbright & Jaworski, LLP

(57) ABSTRACT

Electron-optical rotationally symmetrical lenses inevitably suffer from spherical aberration which often imposes a limit on the resolution. This lens defect cannot be eliminated by compensation by means of rotationally symmetrical fields. In order to enhance the resolution nevertheless, it has already been proposed to correct the spherical aberration by means of a correction device provided with two hexapoles (24, 26) and two rotationally symmetrical transmission lens systems (28, 30). Each transmission lens system in the known correction device consists of two lenses. According to the invention, one or both transmission lens systems can be replaced by a single lens without reducing the corrective capacity (when only one system 30 is replaced) or while reducing it only slightly (when both systems 28, 30 are replaced).

9 Claims, 6 Drawing Sheets

CORRECTION DEVICE FOR CORRECTING THE SPHERICAL ABERRATION IN PARTICLE-OPTICAL APPARATUS

The invention relates to a particle-optical apparatus which includes a particle source for producing a beam of electrically charged particles which travel along an optical axis of the apparatus in order to irradiate an object to be irradiated in the apparatus by means of the particle beam, a focusing lens for focusing the beam of electrically charged particles, and a correction device for correcting the spherical aberration of the focusing lens, which correction device includes a correction unit which is provided with at least two hexapoles wherebetween a first imaging transmission lens system is arranged in order to image one hexapole onto the other hexapole, which correction device also includes a second transmission lens system for imaging a coma-free plane of the focusing lens onto the entrance of the correction unit.

The invention also relates to a correction device for use in such an apparatus.

A correction device of this kind for use in such an apparatus is known from U.S. Pat. No. 5,084,622.

Generally speaking, particle-optical apparatus, such as electron microscopes or electron lithography apparatus, are arranged to irradiate an object to be studied or treated by means of a beam of electrically charged particles (usually an electron beam) which is produced by means of a particle source such as a thermal electron source or an electron source of the field emission type. The aim of the irradiation of the object may be to image these objects to be studied in such apparatus (specimens in electron microscope) or to form very small structures on the object, for example for microelectronics (electron lithography apparatus). In both cases focusing lenses are required to focus the electron beam.

The electron beam can in principle be focused in two ways. According to the first method, a specimen to be examined is more or less uniformly irradiated by the electron beam and an enlarged image of the specimen is formed by means of the focusing lens. The focusing lens is in that case the objective lens of an imaging lens system; the resolution of the objective lens then decides the resolution of the apparatus. Apparatus of this kind are known as Transmission Electron Microscopes (TEM). According to a second focusing method, the emissive surface of the electron source, or a part thereof, is imaged, usually at a strongly reduced scale, on the specimen to be examined (in the Scanning Electron Microscope or SEM or in the Scanning Transmission Electron Microscope or STEM) or on an object on which the relevant microstructure is to be provided (in the lithography apparatus). The image of the electron source (the "spot" which is displaced across the object by means of, for example deflection coils) is again formed by means of an imaging lens system. In the latter case the focusing lens is formed by the objective lens of the spot forming lens system; the resolution of this objective lens decides the spot size of the beam and hence the resolution of the apparatus.

The lenses used in all apparatus of this kind are usually magnetic lenses, but may also be electrostatic lenses. Both types of lens are practically always rotationally symmetrical. Such lenses inevitably have a non-ideal behavior, i.e. they have lens defects, among which the so-called spherical aberration and the chromatic aberration are usually decisive in respect of the resolution of the lens; these lens defects thus determine the limit of the resolution of the known electron optical apparatus. According to a theorem of particle-optics, such lens defects cannot be eliminated by compensation by means of rotationally symmetrical electrical or magnetic fields.

In order to enhance the resolution of the particle-optical apparatus nevertheless, it is known from the cited U.S. Pat. No. 5,084,622 to reduce said lens defects by means of a correction device having a structure which is not rotationally symmetrical. In this structure a coma-free plane of the focusing lens to be corrected is imaged on the input of the correction device by means of a transmission lens system. This correction unit is formed by two hexapoles wherebetween there is arranged an imaging transmission lens system for imaging one hexapole onto the other. The entrance of the correction unit is then formed by the center of the first hexapole, viewed in the direction of the incident electrons.

A configuration of this kind must satisfy very severe requirements as regards manufacturing tolerances, mechanical stability (inter alia with a view to thermal drift) and alignment of the various elements relative to one another. Therefore, the aim is to minimize the number of separate structural components so that the requirements as regards manufacturing tolerances, mechanical stability and alignment can be satisfied as readily as possible.

It is an object of the invention to provide a correction device for correcting spherical aberration whose construction is simpler than that of the known correction device. To this end, the particle-optical apparatus according to the invention is characterized in that the second transmission lens system (i.e. the transmission lens system which images the coma-free plane of the focusing lens to be corrected onto the entrance of the correction unit) consists of one lens. The invention is based on the recognition of the fact that the severe requirements in respect of resolution of such a correction device can be satisfied by means of a transmission lens system constructed as a single lens instead of a transmission lens system constructed as a doublet. The number of components to be aligned is thus reduced by one.

It is to be noted that the single lens which replaces the second transmission lens system in conformity with the invention may also be constructed as an assembly of quadrupoles. It is known per se that an assembly of quadrupoles has the same effect as a rotationally symmetrical lens. Furthermore, not only the effect of the single lens can be realized by means of a system of quadrupoles, but also the effect of the first transmission lens system. Both possibilities are known per se, for example from the book "Electron Optics" by P. Grivet, Pergamon Press, 1965, section 10.4.2. It is also possible to integrate two quadrupoles of said quadrupole systems, situated between the hexapoles, with the units generating the hexapoles. This is a technique which is known per se, the hexapole field then being generated by means of a configuration of a number of physical poles which is larger than the required number of six, for example eight or twelve. The desired hexapole field is then obtained by specific excitation of the physical poles, the desired quadrupole field being obtained by likewise specific excitation of the physical poles which is added to the hexapole excitation.

In a preferred embodiment of the invention, the imaging transmission lens system arranged between the hexapoles of the correction unit consists of one lens. The number of components to be aligned is thus further reduced. In a system of this kind electrons traveling through the first hexapole at a given distance from the optical axis will also travel through the second hexapole at the same distance from the optical axis, but not at the same angle relative to the axis. The latter phenomenon causes a (usually small) second-order image defect. These second-order image defects are sometimes negligibly small, depending on the requirements imposed on the correction device.

If these second-order image defects are not negligibly small, correction can be made by exciting one hexapole slightly different with respect to the other hexapole. In an embodiment of the invention, the difference between the excitations of the hexapoles does not exceed 10%. Experiments have shown that the undesirable second-order aberration can be adequately corrected by means of this method of excitation.

In a further embodiment of the invention, the two hexapoles of the correction unit are identical. This results in a high degree of symmetry of the correction unit so that the correction unit is particularly suitable for a SEM (in which the electrons travel through the correction unit to the lens to be corrected) as well as for a TEM (in which the electrons travel through the correction lens to the correction unit).

In a further embodiment of the invention, each of the hexapoles is constructed as a hexapole doublet. An axial shift of the centers of the hexapoles can thus be achieved without physical displacement of these elements; this makes it easier to satisfy the requirements imposed as regards mechanical precision and alignment.

In a further embodiment of the invention, the transmission lens system present between the hexapoles of the correction unit images one hexapole on the other hexapole with a magnification whose absolute value is between 0.5 and 2. This step enables the use of existing lenses in an existing particle-optical apparatus (having a fixed position therein) as transmission lenses.

In a further embodiment of the invention, the second transmission lens system is formed by the diffraction lens of the particle-optical apparatus. Moreover, in an embodiment of the invention the imaging transmission lens system present between the hexapoles of the correction unit is formed by the intermediate lens of the particle-optical apparatus. Because according to these two steps the lenses already present in the particle-optical apparatus are also used for the purpose of spherical aberration correction, only two additional hexapoles need be provided in the apparatus so as to realize the correction of the spherical aberration.

The invention will be described in detail hereinafter with reference to the Figures in which corresponding reference numerals denote corresponding elements. Therein:

Figure 1:
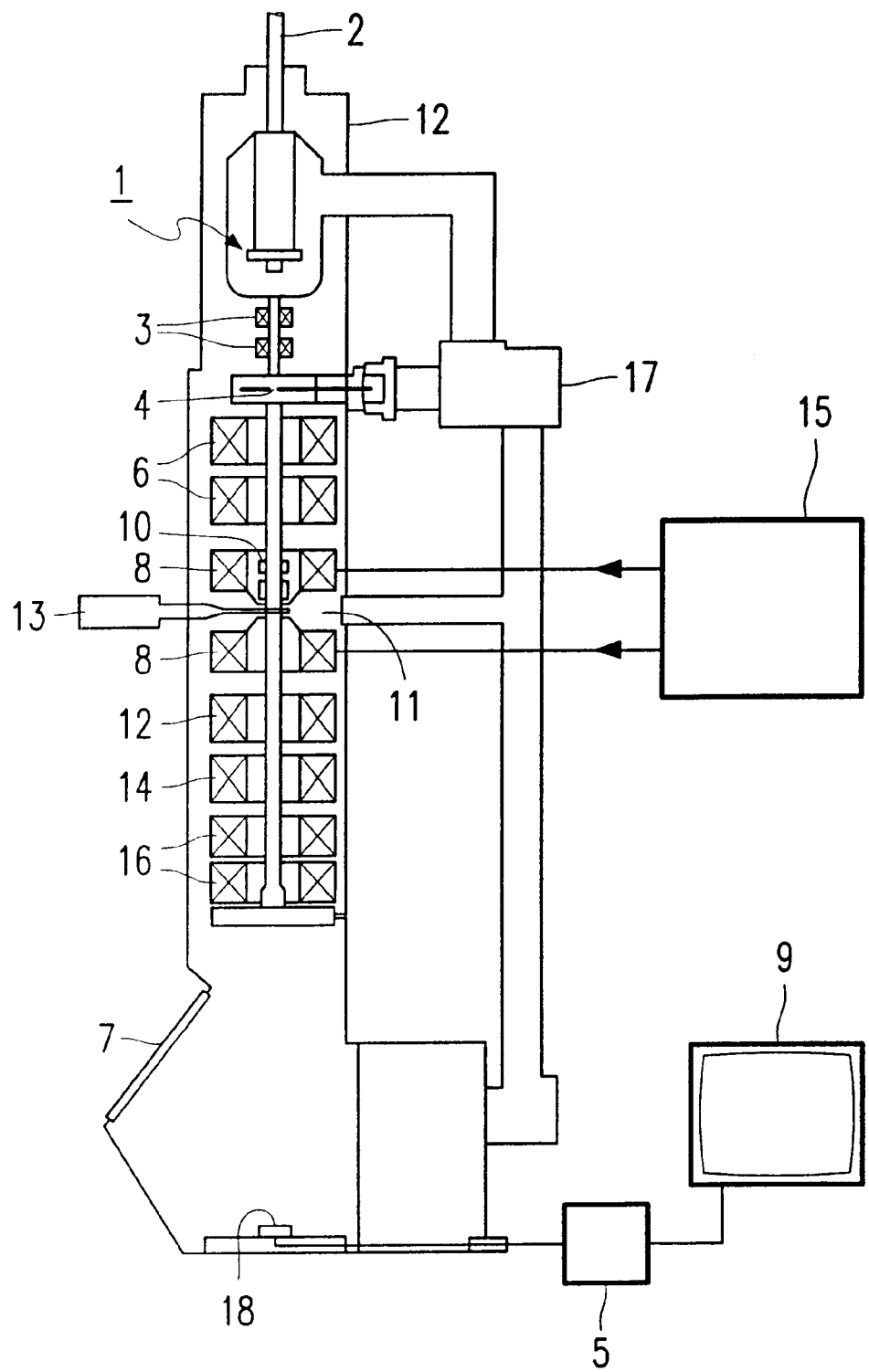
FIG. 1 is a diagrammatic cross-sectional view of a particle-optical apparatus in the form of an electron microscope in which the invention can be used.

FIG. 1 shows a particle-optical apparatus in the form of an electron microscope. The apparatus includes an electron source 1, a beam alignment system 3 and a beam diaphragm 4, a condensor lens 6, an objective lens 8, a beam scanning system 10, an object space 11 with a specimen holder 13, a diffraction lens 12, an intermediate lens 14, a projection lens 16 and an electron detector 18. The objective lens 8, the intermediate lens 14 and the projection lens 16 together constitute an imaging lens system. These elements are accommodated in a housing 19 provided with an electric supply lead 2 for the electron source, a viewing window 7 and a vacuum pumping device 17. The excitation coils for the objective lens 8 are connected to a control unit 15 which is arranged to control the excitation of the imaging lens system. The electron microscope also includes a recording unit with the electron detector 18, an image processing unit 5 and a video display 9 for observing the images formed.

Figure 2:
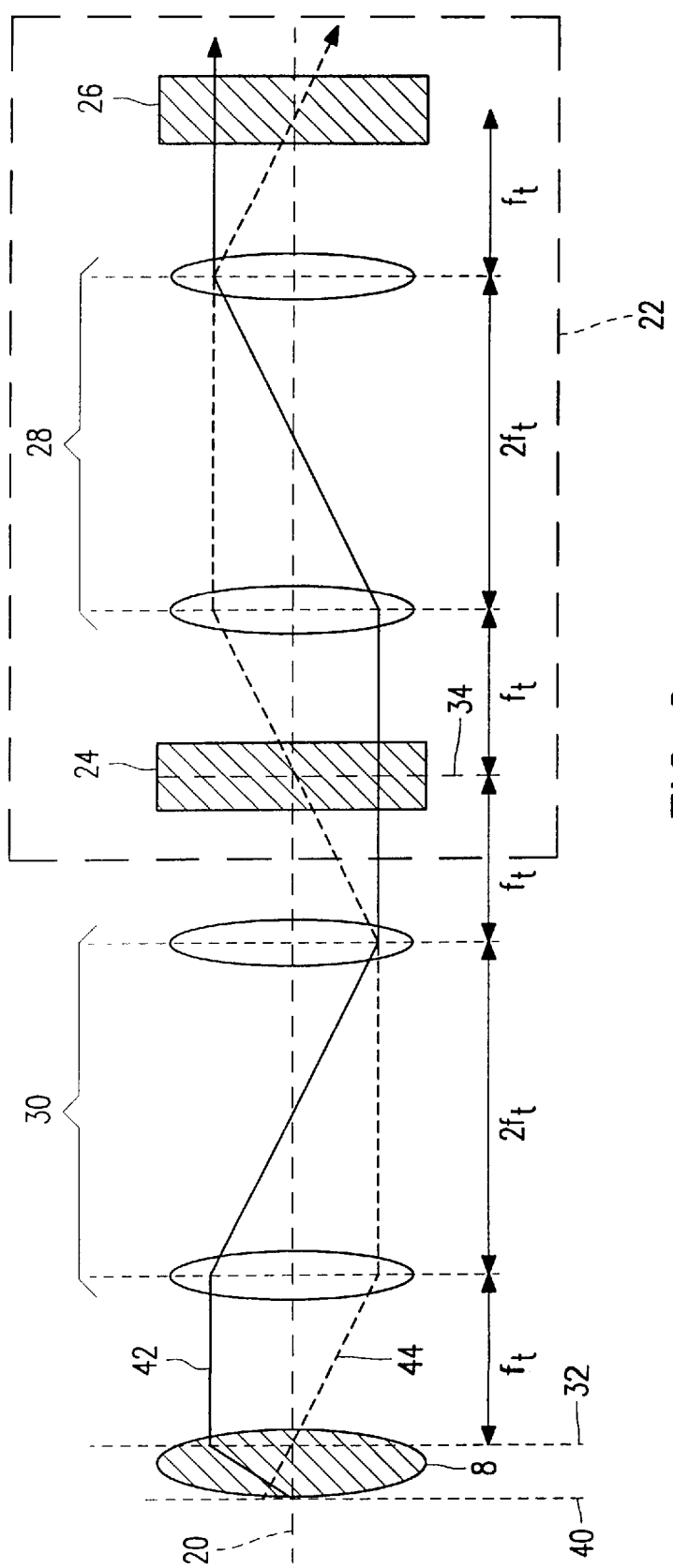
FIG. 2 shows a known correction device for correcting the spherical aberration in an electron microscope.

FIG. 2 shows a correction device as known from the cited U.S. Pat. No. 5,084,622 for correcting the spherical aberration in an electron microscope. This correction device includes a correction unit 22 which is provided with two identical hexapoles 24 and 26 wherebetween there is situated an imaging transmission lens system 28 for imaging the hexapoles 24 and 26 onto one another with a magnification −1.

It is to be noted that the correction device shown in FIG. 2 and the correction devices according to the invention can be used in a TEM as well as in a SEM or a STEM. In the case of a TEM, the electrons first pass through the correction device and subsequently through the objective 8; in the Figure they then travel from right to left. In the case of a SEM and a STEM, the electrons first pass through the objective 8 and subsequently through the correction device; in that case they travel from left to right in the Figure. In FIG. 2, like in the FIGS. 3 and 4 to be described hereinafter, it will be assumed that the electrons travel from left to right.

The focusing lens for focusing the electron beam in this case is the objective 8 of a TEM to be corrected. This objective 8 has a coma-free plane 32 which is imaged onto the entrance plane 34 of the correction unit 22 by a second transmission lens system 30. The system 30 is necessary because the coma-free plane is situated in the magnetic field of the objective so that it could not coincide with the entrance plane 34 which is coincident with the central plane of the hexapole 24. All lenses of the two transmission lens systems 28 and 30 of the known correction device have a focal distance $f_t$. The distances between the various components are as follows. The distance between the objective and the adjoining lens of the system 30 amounts to $f_t$; the distance between the two lenses of the system 30 amounts to 2 $f_t$; the distance between the entrance plane 34 and the adjoining lens of the system 30 is $f_t$; the distance between the entrance plane 34 and the adjoining lens of the system 28 is $f_t$; the distance between the two lenses of the system 28 is 2 $f_t$, and the distance between the hexapole 26 and the adjoining lens of the system 28 is $f_t$. The Figures show the path of two electron rays from the object plane 40 through the transmission lens system 30 and the correction unit 22. One ray 42 extends from a point on the axis in the object plane, whereas the other ray 44 extends from a point in the object plane which is not situated on the axis. The paths of the rays 42 and 44 clearly show that the coma-free plane 32 is imaged onto the entrance of the correction unit 22 by the system 30, and that the center of the hexapole 24 is imaged onto the center of the hexapole 26 by the system 28.

Figure 3:
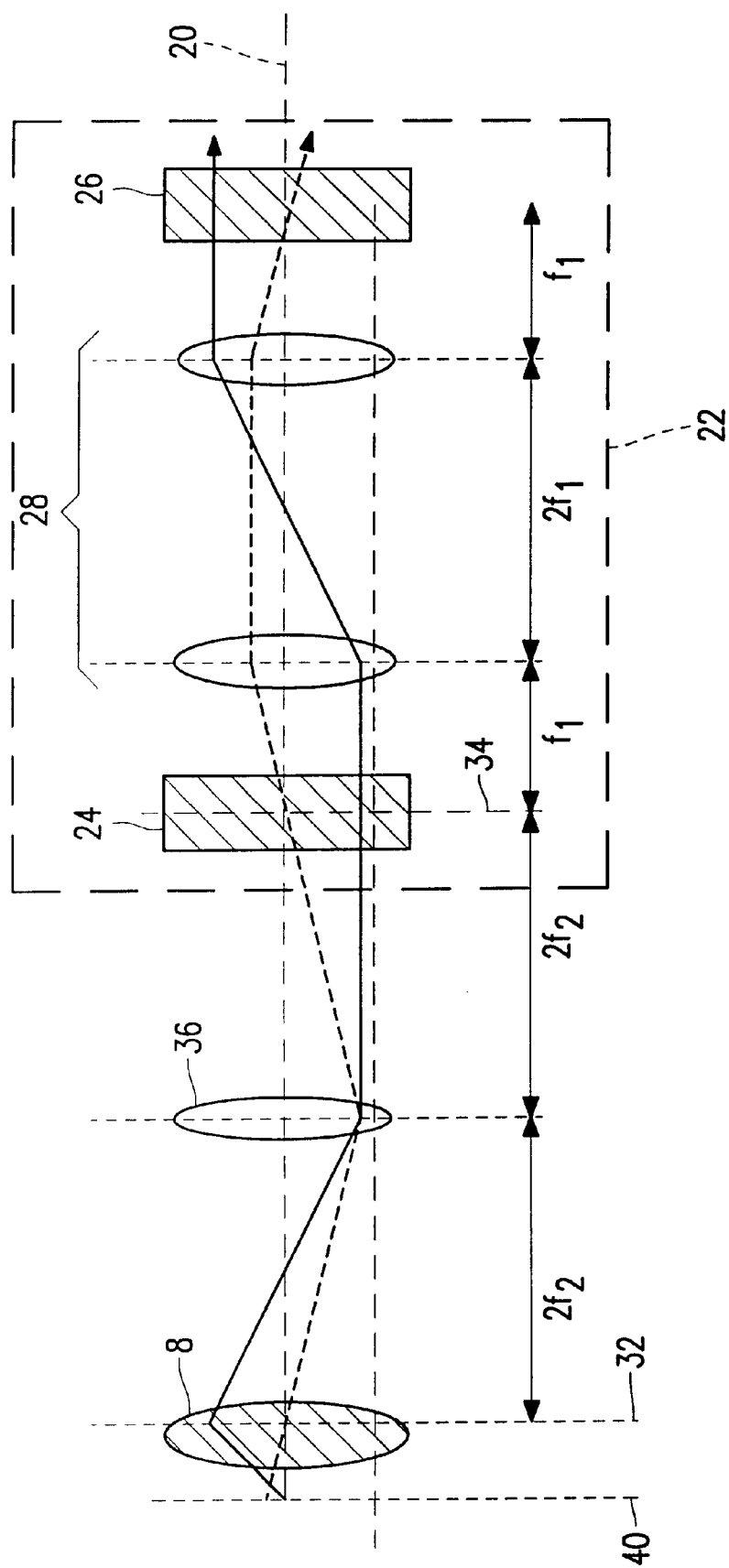
FIG. 3 shows a first embodiment of a correction device according to the invention for correcting the spherical aberration in an electron microscope.

FIG. 3 shows a first embodiment of a correction device according to the invention. This correction device is substantially identical to that shown in FIG. 2, but the transmission lens system 30 in this correction device has been replaced by a single lens 36 having a focal length $f_2$. The distance between the coma-free plane 32 of the objective 8 and the transmission lens 36 equals 2 $f_2$, like the distance between the transmission lens 36 and the entrance 34 of the correction unit 22. The lenses of the transmission lens system 28 have a focal length $f_1$ which may be equal (but not necessarily so) to the focal length $f_2$. The distance between the entrance plane 34 and the adjoining lens of the system 28 is $f_1$; the distance between the two lenses of the system 28 is 2 $f_1$, and the distance between the hexapole 26 and the adjoining lens of the system 28 is $f_1$. The correction effect of the correction device shown in FIG. 3 will be described in detail with reference to FIG. 6.

It is to be noted that the configuration shown in FIG. 3 also enables correction of the chromatic aberration of the objective lens 8. To this end, a correction system of the so-called "Wien" type must be arranged at the center between the two transmission lenses of the system 28. A uniform electric field and a magnetic field, extending perpendicularly thereto, are generated in such a system (both fields extending perpendicularly to the optical axis). A suitable quadrupole field is also superposed on these two fields. A system of this kind is known per se from a previous patent application in the name of applicant (=EP 96202638.1=U.S. Ser. No. 08/932,981=WO IB97/00854).

Figure 4:
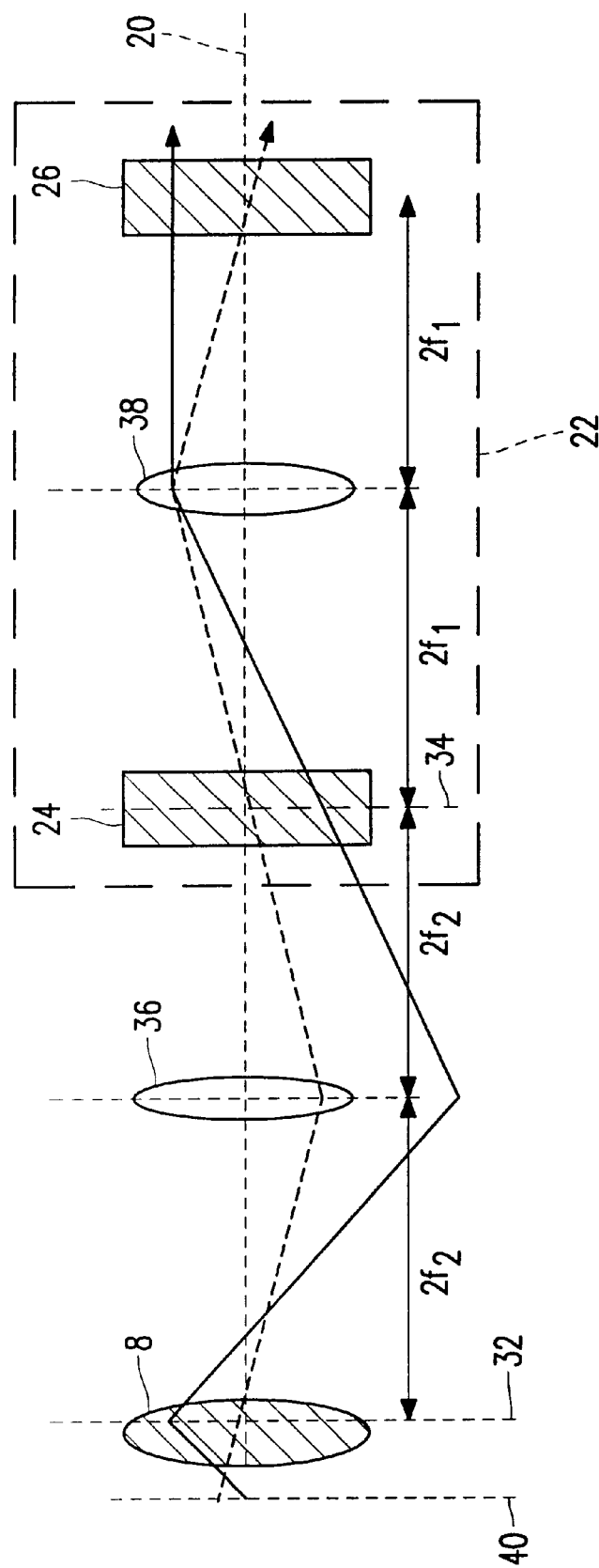
FIG. 4 shows a further embodiment of a correction device according to the invention for correcting the spherical aberration in an electron microscope.

FIG. 4 shows a further embodiment of a correction device according to the invention. This correction device is substantially identical to that shown in FIG. 3, but the transmission lens system 28 of the correction unit 22 has now been replaced by a single lens 38. Furthermore, the distance between the center of the hexapole 24 and the transmission lens 38 equals 2 $f_1$, like the distance between the transmission lens 38 and the center of the hexapole 26. Experiments performed by means of this embodiment have shown that the excitation of the hexapoles 24 and 26 should not be fully identical; a better correction effect is achieved when the excitation of the hexapole 26 is slightly stronger than that of the hexapole 24. It has been found that an excitation difference which amounts to approximately 10% suffices; it has also been found that for the embodiment shown in FIG. 4 a difference of 3% offers a satisfactory result. The correction effect of the correction device shown in FIG. 3 will be described in detail with reference to FIG. 7.

Figure 5:
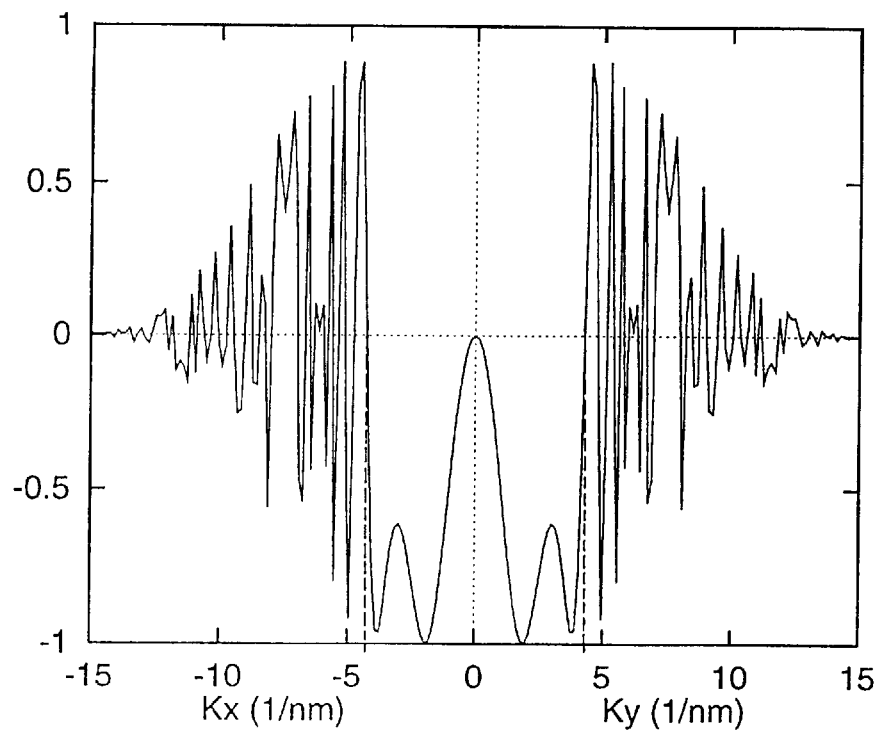
FIG. 5 shows the phase contrast transfer function associated with an objective without correction device.

FIG. 5 shows the so-called phase contrast transfer function associated with an objective without correction device. It is customary to describe the image in a particle-optical instrument, such as an electron microscope, by means of the Phase Contrast Transfer Function or PCTF. This function establishes a relationship between the wave function of the imaging particle beam at the area of the object and that at the area of the image. This PCTF represents the amplitude of the imaging electron wave as a function of the spatial frequency of the object details. The PCTF varies in an oscillatory fashion, in dependence on the spatial frequency within the object, in all particle-optical instruments. This means that sign reversal occurs in the amplitude of the imaging wave. As a result of this reversal of sign, the contrast formation is dependent not only on the details present in the object to be imaged, but also on the properties of the PCTF, and hence on the imaging instrument. Consequently, contrast differences may occur which are not caused by contrast within the object but by (resolution-limiting) instrument properties.

The resolution of the imaging lens is now defined as the region (measured as the reciprocal value of the spatial frequency, so the fineness of the details to be observed in the object) in which no sign reversal of the PCTF has occurred yet.

Figure 6:
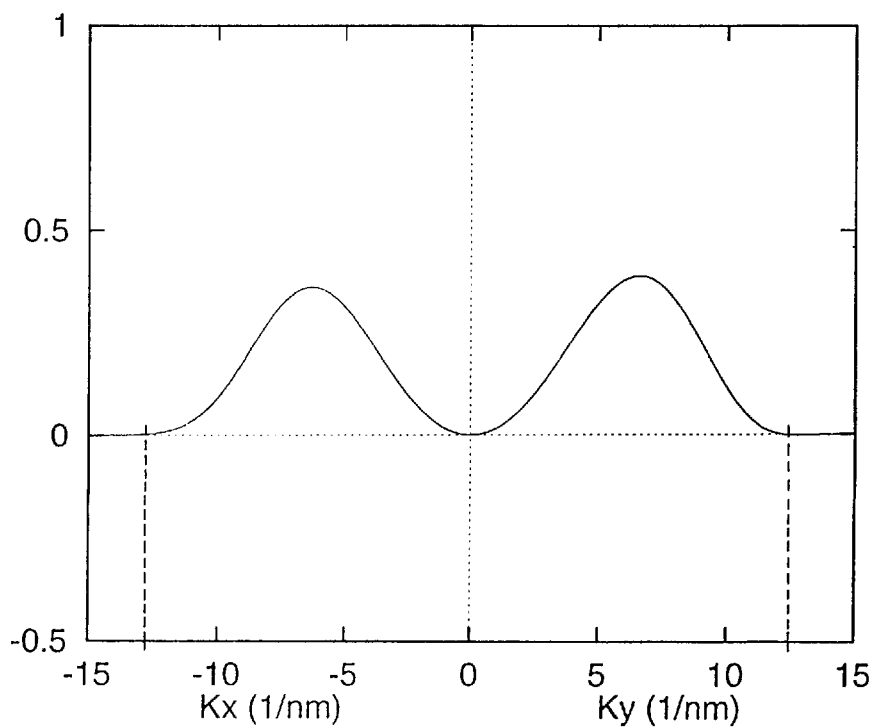
FIG. 6 shows the phase contrast transfer function associated with a first embodiment of a correction device according to the invention, as described with reference to FIG. 3, for a point situated on the optical axis.
Figure 7:
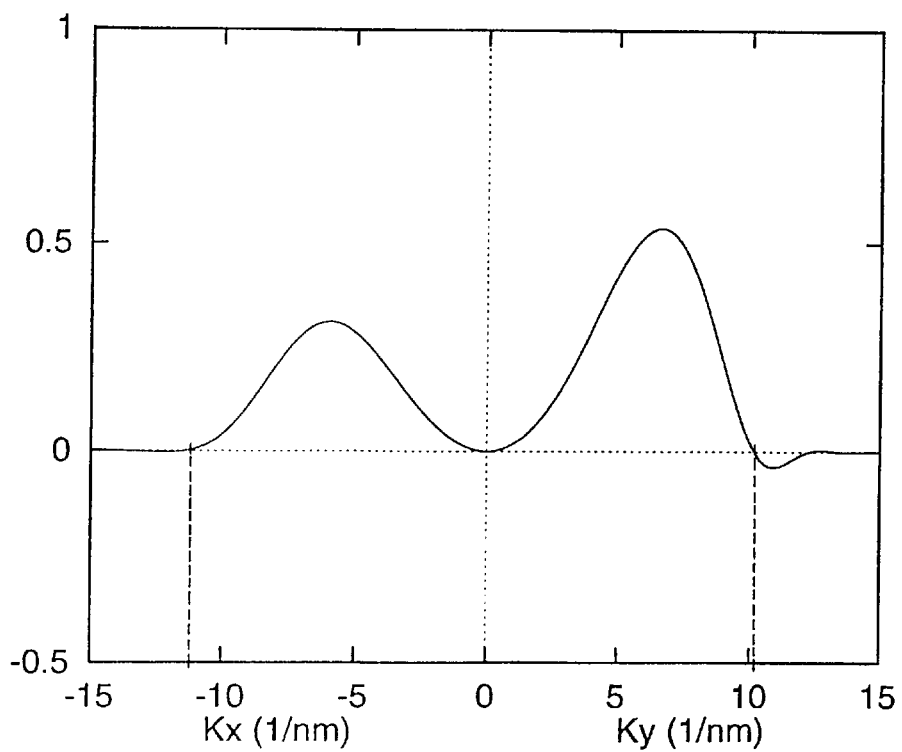
FIG. 7 shows the phase contrast transfer function associated with a first embodiment of a correction device according to the invention, as described with reference to FIG. 3, for a point which is not situated on the optical axis.
Figure 8:
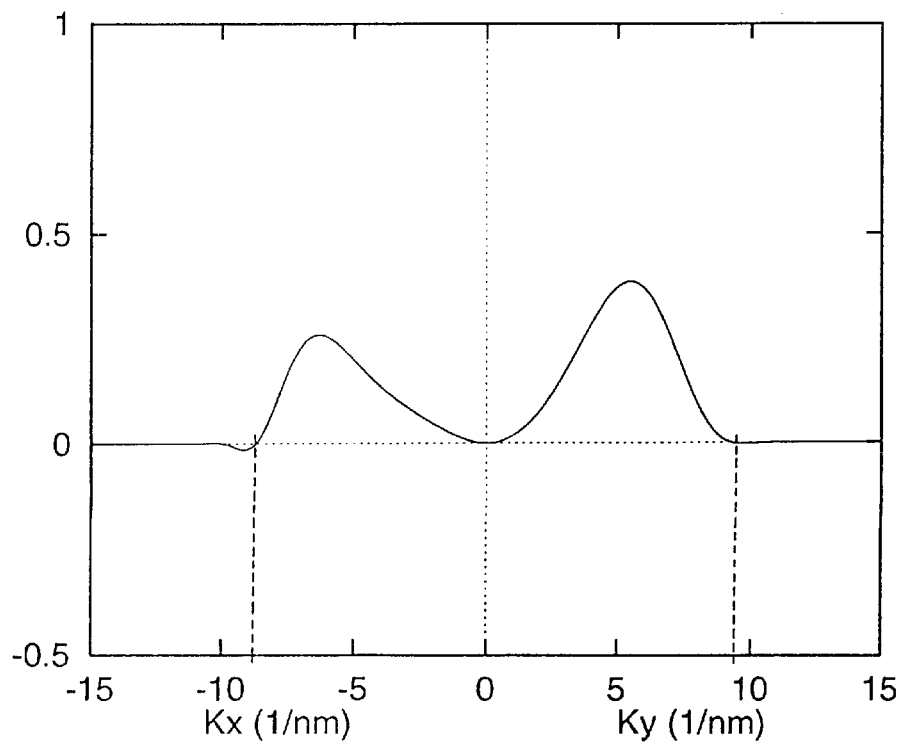
FIG. 8 shows the phase contrast transfer function associated with a further embodiment of a correction device as described with reference to FIG. 4.

The PCTF of FIG. 5, like that of the FIGS. 6, 7 and 8, has been obtained by simulation by means of a known computer program. This computer program is known as "TRC/TRASYS" and is available from Delft Technical University, Department of Applied Physics, Particle Optics Group, Delft, the Netherlands. The electrical fields required according to said simulation program can be entered in the form of an analytic expression or can be calculated by means of a number of other programs which are known as "MLD, Magnetic Lens Design" and "MMD, Magnetic Multipole Design", which are also available from said Delft Technical University.

The simulation of the PCTF of FIG. 5 is based on the image in the optimum focus (i.e. the location on the optical axis with the smallest beam cross-section; this is generally not the location of the paraxial focus). The optimum focus was in this case situated at a distance of 65 nm from the paraxial focus. The following assumptions were made: an objective with a focal length $f_{obj}$=1.7 mm, a chromatic aberration coefficient $C_c$=1.3 mm, a spherical aberration coefficient $C_s$=1.2 mm, an acceleration voltage for the electron beam amounting to V=200 kV, and an energy spread $\Delta E$ in the electron beam amounting to $\Delta E$=0.6 eV.

The PCTF of FIG. 5 has been measured for two mutually perpendicular directions x and y. Minor differences may occur for the two directions in the PCTF of the FIGS. 5–8, which differences are caused by the fact that the electron beam has obtained a sextuple symmetry due to the hexapoles, so that the appearance of the beam for the x direction deviates slightly from that for the y direction. As is shown in FIG. 5, the region (measured as the reciprocal value of the spatial frequency $K_x$ and $K_y$, respectively, in the object) in which sign reversal of the PCTF has not yet occurred is situated in the interval with a spatial frequency of between $-4$ nm$^{-1}$ and 4 nm$^{-1}$. Thus, this corresponds to a resolution of 0.25 nm.

FIG. 6 shows the phase contrast transfer function associated with an embodiment of the correction device according to the invention as shown in FIG. 3. This PCTF has been determined in the same way as that in FIG. 5; the distance between the optimum focus and the paraxial focus amounted to 7.5 nm. Furthermore, the following assumptions were made: the thickness $d_6$ of the hexapole=30 mm, the radius of the circle enclosed between the poles $r_i$=5 mm, the number of ampere turns of the hexapole NI=140 At, and $f_1$=$f_2$=30 mm for the focal length of the transmission lenses. As is clearly shown in FIG. 6, the region without sign reversal extends to approximately 12 nm$^{-1}$, corresponding to a resolution of approximately 0.08 nm. These numbers clearly illustrate that suitable correction of the spherical aberration can also be achieved by means of only one transmission lens 36 between the objective 8 and the correction unit 22.

FIG. 7 shows the phase contrast transfer function associated with an embodiment of the correction device according to the invention as shown in FIG. 3. This PCTF has been determined in the same way as in FIG. 6, be it in this case for a point of the object to be imaged which is situated at a distance of 100 nm from the optical axis. Therefore, this Figure is of special importance to a TEM, since therein an entire field of view of an object, so also the points which are not situated on the axis, is also imaged. All further data of this Figure are the same as those of FIG. 6. As is clearly shown in FIG. 7, the region without sign reversal extends approximately as far as 10 nm$^{-1}$, corresponding to a resolution of approximately 0.1 nm. These numbers clearly illustrate that suitable correction of the spherical aberration can also be achieved by means of only a single transmission lens 36 between the objective 8 and the correction unit 22.

FIG. 8 shows the phase contrast transfer function associated with an embodiment of the correction device according to the invention as shown in FIG. 4. This PCTF has been determined like that in FIG. 6, be it with the following differences: the distance between the optimum focus and the paraxial focus amounted to 7 nm. Furthermore, the thickness $d_6$ of the hexapole was assumed to be $d_6=10$ mm; the radius of the circle enclosed between the poles was assumed to be $r_i=3$ mm; the number of ampere turns of the hexapole 24 was assumed to be NI=164 At; the number of ampere turns of the hexapole 26 was assumed to be Ni=170 At, and the focal distance of the transmission lenses was assumed to be $f_1=f_2=30$ mm. As is clearly shown in FIG. 8, the region without sign reversal extends to approximately 9 nm$^{-1}$ for the x plane as well as for the y plane, corresponding to a resolution of approximately 0.11 nm. These numbers clearly demonstrate that resolution enhancement can be achieved by correction of the spherical aberration while using only one transmission lens 38 between the two hexapoles 24 and 26.

What is claimed is:

1. A particle-optical apparatus which includes:
    a particle source (1) for producing a beam of electrically charged particles which travel along an optical axis (20) of the apparatus in order to irradiate an object (13) to be irradiated in the apparatus by means of the particle beam,
    a focusing lens (8) for focusing the beam of electrically charged particles, and
    a correction device for correcting the spherical aberration of the focusing lens,
        which correction device includes a correction unit (22) which is provided with at least two hexapoles (24, 26) wherebetween a first imaging transmission lens system (28) is arranged in order to image one hexapole onto the other hexapole,
        which correction device also includes a second transmission lens system (30) for imaging a coma-free plane (32) of the focusing lens onto the entrance of the correction unit,
characterized in that
    the second transmission lens system consists of one lens (36).

2. A particle-optical apparatus as claimed in claim 1, in which the imaging transmission lens system (28) arranged between the hexapoles (24, 26) of the correction unit (22) consists of one lens (38).

3. A particle-optical apparatus as claimed in claim 2, in which the difference between the excitations of the hexapoles does not exceed 10%.

4. A particle-optical apparatus as claimed in claim 1, in which the two hexapoles (24, 26) are identical.

5. A particle-optical apparatus as claimed in claim 1, in which each of the two hexapoles (24, 26) is constructed as a hexapole doublet.

6. A particle-optical apparatus as claimed in claim 1, in which the transmission lens system (38) present between the hexapoles (24, 26) of the correction unit (22) images one hexapole on the other hexapole with a magnification whose absolute value is between 0.5 and 2.

7. A particle-optical apparatus as claimed in claim 1, in which the second transmission lens system (30) is formed by the diffraction lens (12) of the particle-optical apparatus.

8. A particle-optical apparatus as claimed in claim 1, in which the imaging transmission lens system (38) arranged between the hexapoles of the correction unit is formed by the intermediate lens (14) of the particle-optical apparatus.

9. A correction unit as defined in claim 2.

* * * * *

UNITED STATES PATENT AND TRADEMARK OFFICE
CERTIFICATE OF CORRECTION

PATENT NO.    : 6,191,423 B1  
DATED         : February 20, 2001  
INVENTOR(S)   : Krijn and van der Mast It is certified that error appears in the above-identified patent and that said Letters Patent is hereby corrected as shown below:

Please label FIG. 2 as -- PRIOR ART --

Signed and Sealed this

First Day of January, 2002

Attest:

JAMES E. ROGAN  
*Director of the United States Patent and Trademark Office*

*Attesting Officer*